United States Patent [19]

Aoyama et al.

[11] Patent Number: 5,266,526
[45] Date of Patent: Nov. 30, 1993

[54] METHOD OF FORMING TRENCH BURIED WIRING FOR SEMICONDUCTOR DEVICE

[75] Inventors: Masaharu Aoyama, Fujisawa; Masahiro Abe, Yokohama, both of Japan

[73] Assignee: Kabushiki Kaisha Toshiba

[21] Appl. No.: 854,812

[22] Filed: Mar. 19, 1992

[30] Foreign Application Priority Data

Mar. 19, 1991 [JP] Japan .................. 3-52973

[51] Int. Cl.⁵ .................. H01L 21/441; H01L 21/469
[52] U.S. Cl. .................. 437/195; 437/198; 437/229; 437/944; 437/192; 148/DIG. 100
[58] Field of Search .............. 437/229, 198, 944, 195, 437/192; 148/DIG. 100

[56] References Cited

U.S. PATENT DOCUMENTS

| | | | |
|---|---|---|---|
| 4,335,506 | 6/1982 | Chiu et al. | 437/198 |
| 4,508,815 | 4/1985 | Ackmann et al. | 437/944 |
| 5,069,747 | 12/1991 | Cathey et al. | 156/653 |

FOREIGN PATENT DOCUMENTS

| | | | |
|---|---|---|---|
| 61-156786 | 7/1986 | Japan . | |
| 63-12155 | 1/1988 | Japan | 437/198 |
| 1-114042 | 5/1989 | Japan . | |
| 2-123740 | 5/1990 | Japan . | |

*Primary Examiner*—T. N. Quach
*Attorney, Agent, or Firm*—Foley & Lardner

[57] ABSTRACT

A method of forming a trench buried wiring on a semiconductor device. The method includes the steps of: forming a trench in a first insulating film formed on a semiconductor substrate, by using as a mask a photoresist layer, the trench having substantially an upright step; depositing a first electrode material on the surface of the photoresist layer and on the bottom of the trench, while leaving the photoresist layer; removing the photoresist layer and the first electrode material on the photoresist layer while leaving the first electrode material only on the bottom of the trench; and filling a second electrode material in the trench to form a composite electrode with the second electrode material being superposed on the first electrode material.

17 Claims, 4 Drawing Sheets

METHOD OF FORMING TRENCH BURIED WIRING FOR SEMICONDUCTOR DEVICE

FIELD OF THE INVENTION

The present invention relates to a method of forming trench buried wiring, and more particularly to a method of forming trench buried wiring suitable for use as electrode wiring of a semiconductor device.

BACKGROUND OF THE INVENTION

FIGS. 1A and 1B are cross sectional views showing processes of a conventional method of forming trench buried wiring on a semiconductor device. As shown in FIG. 1A, a thermal oxidization film 2 is formed on a semiconductor substrate 1. Formed thereafter is a trench (an opening in the thermal oxidation film) 3 having a rectangular cross section. Thereafter, electrode material 4 such as Al alloy or W is deposited to a sufficient thickness. Then, the whole surface is etched back, or it is etched back after a flattening coating film 6 such as a resist film, is coated thereon. As a result, as shown in FIG. 1B, the electrode material 4 on the surface of the thermal oxidation film 2 is removed, leaving the electrode material (metal) 4 forming an electrode 5 only within the thermal oxidation film opening 3.

With the above-described conventional method, the electrode material 4 used is unnecessarily thick, while almost all the electrode material 4 at the area other than the thermal oxidation film opening 3 is etched back. Namely, the material efficiency is very poor.

Tungsten or the like used as the metal material (electrode material 4) provides relatively easy dry etching. However, using Cu as the metal material is very difficult in forming Cu wiring through an RIE method using Cl-based gas. No ion milling technique is known which does not use reaction gas. However, this technique may damage semiconductor substrates.

With the etching-back method, it is possible to leave the electrode material 5 within the thermal oxidization opening 3 if it is relatively small. However, as shown in the cross section of FIG. 2, if a thermal oxidization film opening 3a is used which is larger than the thermal oxidization film opening 3, the electrode material 5 is etched greatly, leaving the electrode material 4 as side walls 5a. It is therefore difficult to form wiring by leaving electrode material or the like within the large opening 3a.

SUMMARY OF THE INVENTION

The present invention has been made in consideration of the above circumstances. It is an object of the present invention to reliably form flat Cu wiring within a trench without a need of dry etching which is difficult in controlling Cu etching.

Using as a mask a photoresist layer formed on an insulating film on a semiconductor substrate, a wiring burying trench having substantially an upright step is formed. Leaving the photoresist layer as it is, a first electrode material is deposited on the photoresist layer and on the bottom of the trench. Next, the photoresist layer and the first electrode material on the photoresist layer are lifted off (removed). Then, a second electrode material is filled in within the trench to lay it over the first electrode material.

As described above, according to the present invention, irrespective of the area (width) of a trench in which wiring material is buried, it is possible to form flat wiring. Furthermore, the degree of freedom of selecting wiring material is great, thereby improving the performance and reliability of semiconductor devices.

DESCRIPTION OF THE PREFERRED EMBODIMENTS

Preferred embodiments of the present invention will be described with reference to the accompanying drawings.

FIGS. 3A to 3F are cross sections showing a method of forming wiring according to an embodiment of the present invention.

Figure 1A:
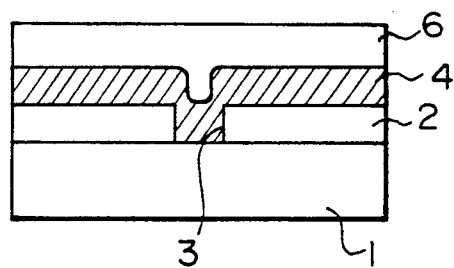
FIGS. 1A and 1B are cross sections showing a conventional method of forming wiring.
Figure 1B:
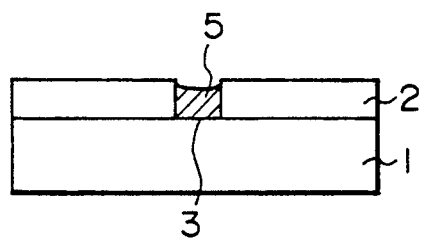
Figure 2:
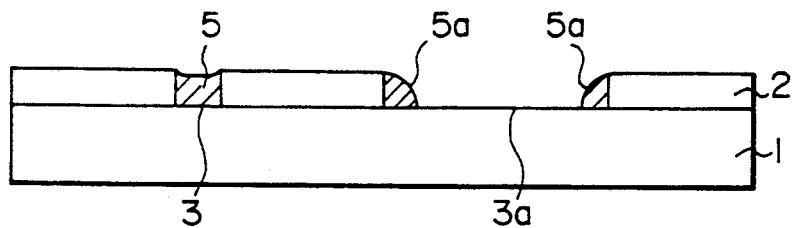
FIG. 2 is a cross section of a semiconductor device showing wiring formed on a wide trench by using a conventional method of forming wiring.
Figure 3A:
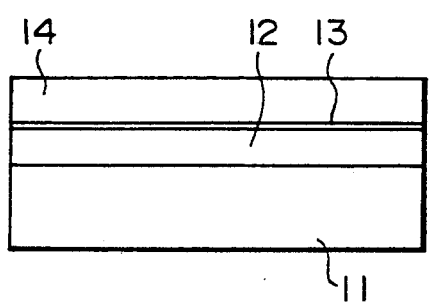
FIGS. 3A to 3F are cross sections showing a method of forming trench buried wiring on a semiconductor device according to an embodiment of the present invention.

First, as shown in FIG. 3A, a thermal oxidization film 12 having a thickness of 500 nm is formed on a semiconductor substrate 11. On the thermal oxidization film 12, a silicon nitride film 13 having a thickness of 100 nm is deposited. On the silicon nitride film 13, a CVD-SiO$_2$ film 14 having a thickness of 600 nm is formed.

Figure 3B:
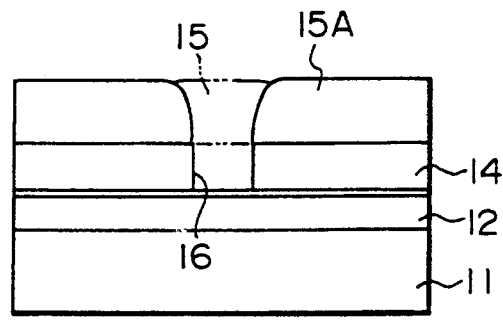

Next, as shown in FIG. 3B, on the CVD-SiO$_2$ film 14, a photoresist 15 is coated to a thickness of 800 nm. A desired area (area to which wiring is to be formed) of the photoresist 15 is selectively exposed and developed to form a photoresist mask 15A. Using this mask 15A, part of the CVD-SiO$_2$ film 14 is etched through an RIE method. As a result, in the CVD-SiO$_2$ film 14, a wiring opening trench 16 is formed which has a rectangular cross section and an upright step.

Figure 3C:
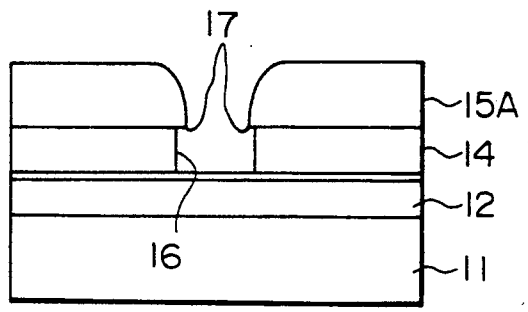

Next, as shown in FIG. 3C, this device is dipped in thin NH$_4$F solution to etch the wiring opening trench 16 in the CVD-SiO$_2$ film 14 laterally about 50 nm. An overhang portion 17 is therefore formed relative to the photoresist 15.

Figure 3D:
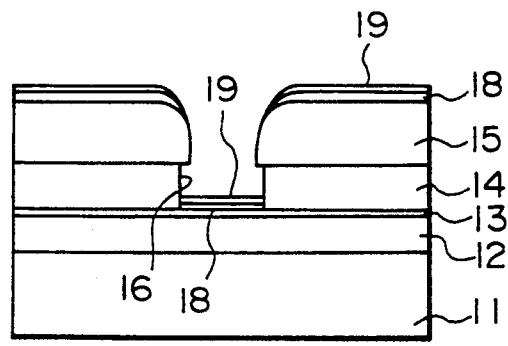

As shown in FIG. 3D, by means of an electron beam evaporation method, a Ti film 18 of 80 nm thick and a Pt film 19 of 50 nm thick are consecutively deposited.

Figure 3E:
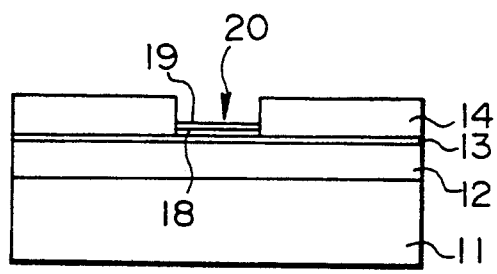

Next, as shown in FIG. 3E, the device is dipped in resist lift-off liquid to dissolve the remaining photoresist 15 on the CVD-SiO$_2$ film 14. At this time, the Pt/Ti laminated layer on the photoresist 15 is also removed. A Pt/Ti wiring 20 is formed therefore only on the bottom of the wiring opening trench 16.

Figure 3F:
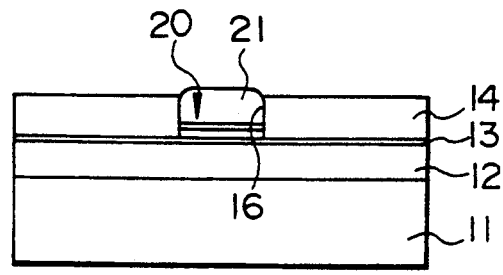

Next, as shown in FIG. 3F, Cu of 500 nm thickness is selectively electroless-plated only on the Pt/Ti wiring 20 by using Cu-based plating liquid. Next, the wiring opening trench 16 in the first formed CVD-SiO$_2$ film 14 is filled in with a Cu selective growth layer 21. In this manner, a Cu/Pt/Ti laminated layer electrode is formed within the wiring opening trench 16.

With the above-described process, the buried Cu-based electrode having generally a flat wiring structure can be formed within the trench in the CVD-SiO$_2$ film 14.

On the silicon substrate herein used, semiconductor elements such as transistors, resistors, capacitors or the like may be formed.

Figure 4A:
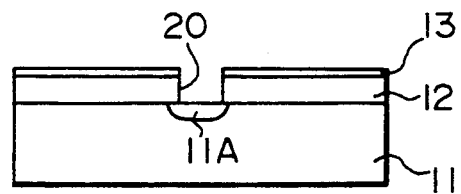
FIGS. 4A to 4H are cross sections showing a method of forming wiring, wherein a trench for connection of a semiconductor device element to an electrode is already formed.

Openings for connection between these elements and electrodes may be formed in advance. In such a case, the processes of the method are as follows. Namely, as shown in FIG. 4A, an opening 20 is assumed to have been formed in advance, the opening 20 passing through a silicon nitride film 13 and a thermal oxidization film 12. In FIG. 4A, 11A represents an impurity diffusion region which is assumed in this case to be electrically connected in advance to an element within the substrate 11.

Figure 4B:
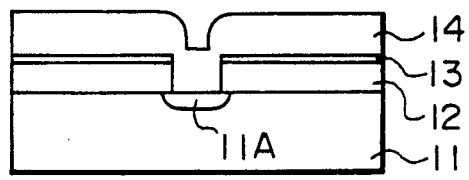

Next, as shown in FIG. 4B, a CVD-SiO$_2$ film 14 is formed.

Figure 4C:
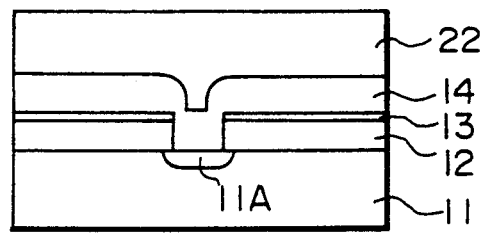

A photoresist 22 is then deposited as shown in FIG. 4C.

Figure 4D:
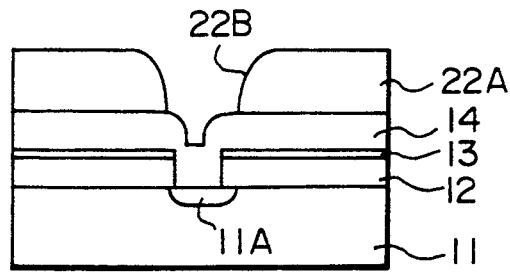

Next, as shown in FIG. 4D, the photoresist 22 is selectively exposed and developed to form a photoresist mask 22A having an opening 22B.

Figure 4E:
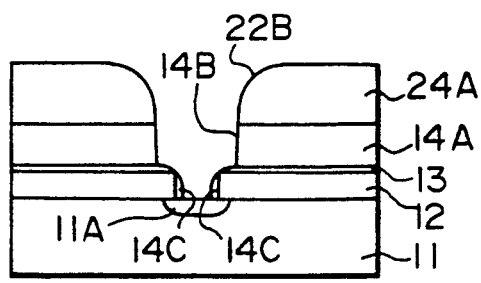

Next, as shown in FIG. 4E, using the photoresist mask 22A, the CVD-SiO$_2$ film 14 (14A) is etched through an RIE method to form an opening 14B and a side wall 14C.

Figure 4F:
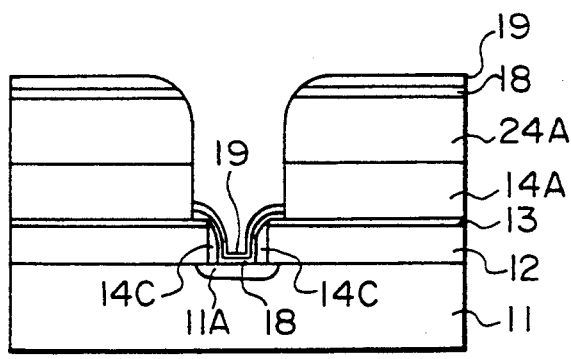

Then, as shown in FIG. 4F, a Ti film 18 of 80 nm thick and a Pt film 19 of 50 nm thick are deposited by means of an electron beam evaporation method.

Figure 4G:
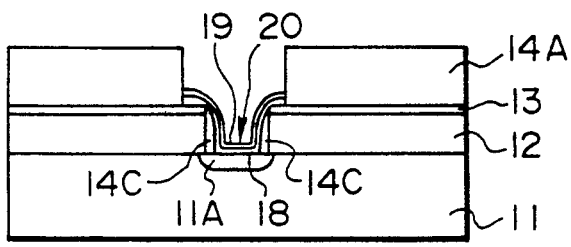

Next, as shown in FIG. 4G, the device is dipped in resist lift-off liquid to remove the photoresist mask 24A and the Ti film 18 and Pt film 19 on the mask 24A.

Figure 4H:
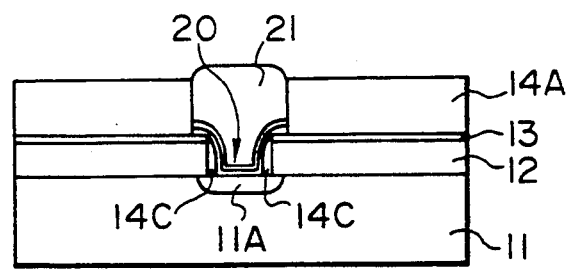

Next, as shown in FIG. 4H, using Cu-based plating liquid, Cu of 500 nm thick is selectively electroless-plated only on the Pt/Ti wiring 20. Then, a Cu selective growth layer 21 is grown within the trench.

The present inventors carried- out the above-described processes to obtain substantially flat Cu wiring. Both fine wiring and wide trenches could be used without an RIE method difficult in etching and without ion etching with its associated possible great damages.

Cu wiring is very effective in solving the following problems of aluminum alloy wiring presently used as main trend:

(1) weak to electromigration,
(2) occurrence of knots and breakage by stress migration,
(3) short circuiting between wirings by hillocks on wiring surface caused during thermal treatment, and
(4) corrosion.

Cu has a smaller specific resistance than aluminum, providing less voltage drop across wiring and less power consumption. It is therefore effective for large scale integrated circuits and power devices.

In the above embodiments, one wiring is formed by way of example. The main object of a flat wiring structure is a multi-layered wiring structure. By repetitively carrying out the present embodiment method, obviously it is possible to obtain a multi-layered wiring structure.

What is claimed is:

1. A method of forming a trench buried wiring on a semiconductor device, comprising:

a first step of depositing a first insulating film on an intermediate semiconductor device, said intermediate semiconductor device having a layer formed on a semiconductor substrate, said layer having a first opening extending to the surface of said substrate, and said first insulating film being deposited on the surface of said layer and buried in said first opening;

a second step of forming a photoresist layer on said first insulating film, and patterning said photoresist layer to form a photoresist mask, said photoresist mask having a second opening above said first opening;

a third step of anisotropically etching said first insulating film using said photoresist mask to form a third opening in said first insulating film, said third opening extending to the surface of said substrate via said first opening, and said first insulating film leaving as a side wall on the inner wall of said first opening;

a fourth step of depositing a first electrode material on said photoresist mask and on the bottom of said substrate exposed in said first opening;

a fifth step of removing said photoresist mask and said first electrode material on said photoresist mask, said first electrode material being left only in said first opening as a first electrode; and a sixth step of burying a second electrode material in said first to third openings to form a composite electrode with a second electrode being laid over said first electrode.

2. A method according to claim 1, wherein said first electrode material is a material made of at least one material selected from the group consisting of Ti, Ta, W, Pt, Pd, silicide or nitride thereof, and said second electrode material is Cu.

3. A method according to claim 2, wherein said first electrode material has a two-layer structure including a lower Ti layer and a higher Pt layer.

4. A method according to claim 3, wherein said Ti film and said Pt film are formed by means of an electron beam evaporation method.

5. A method according to claim 4, wherein forming said second electrode material in said sixth step is performed by a step of plating said second electrode material on said first electrode material, and by a step of growing said second electrode material on said plated layer.

6. A method according to claim 3, wherein forming said second electrode material in said sixth step is performed by a step of plating said second electrode material on said first electrode material, and by a step of growing said second electrode material on said plated layer.

7. A method according to claim 2, wherein forming said second electrode material in said sixth step is performed by a step of plating said second electrode material on said first electrode material, and by a step of growing said second electrode material on said plated layer.

8. A method according to claim 1, wherein forming said second electrode material in said sixth step is performed by a step of plating said second electrode material on said first electrode material, and by a step of growing said second electrode material on said plated layer.

9. A method of forming a trench buried wiring on a semiconductor device, comprising:

a first step of depositing a first insulating film on an intermediate semiconductor device, said intermediate semiconductor device having a layer formed on a semiconductor substrate, said layer having a first opening extending to the surface of said substrate, said first insulating film being deposited on the surface of said layer and buried in said first opening;

a second step of forming a photoresist layer on said first insulating film, and patterning said photoresist layer to form a photoresist mask, said photoresist mask having a second opening above said first opening;

a third step of anisotropically etching said first insulating film using said photoresist mask to form a third opening in said first insulating film, said third opening extending to the surface of said substrate via said first opening;

a fourth step of depositing a first electrode material on said photoresist mask and on the bottom of said substrate exposed in said first opening;

a fifth step of removing said photoresist mask and said first electrode material on said photoresist mask, said first electrode material being left only in said first opening as a first electrode; and a sixth step of burying a second electrode material in said first to third openings to form a composite electrode with a second electrode being laid over said first electrode.

10. A method according to claim 9, wherein said first electrode material is material made of at least one material selected from the group consisting of Ti, Ta, W, Pt, Pd, silicide or nitride thereof.

11. A method according to claim 10, wherein said first electrode material has a two-layer structure including a lower Ti layer and an upper Pt layer.

12. A method according to claim 11, wherein said Ti film and said Pt film are formed by means of an electron beam evaporation method.

13. A method according to claim 12, wherein forming said second electrode material in said sixth step is performed by a step of plating said second electrode material on said first electrode material, and by a step of growing said second electrode material on said plated layer.

14. A method according to claim 11, wherein forming said second electrode material in said sixth step is performed by a step of plating said second electrode material on said first electrode material, and by a step of growing said second electrode material on said plated layer.

15. A method according to claim 10, wherein said second electrode material is Cu.

16. A method according to claim 9, wherein forming said second electrode material in said sixth step is performed by a step of plating said second electrode material on said first electrode material, and by a step of growing said second electrode material on said plated layer.

17. A method according to claim 9, wherein forming said second electrode material in said sixth step is performed by a step of plating said second electrode material on said first electrode material, and by a step of growing said second electrode material on said plated layer.

* * * * *